(12) United States Patent
Richter et al.

(10) Patent No.: US 6,181,855 B1
(45) Date of Patent: Jan. 30, 2001

(54) OPTICAL AND/OR ELECTRO-OPTICAL CONNECTION HAVING ELECTROMAGNETIC RADIATION-PRODUCED WELDS

(75) Inventors: Hartwig Richter, Darmstadt; Manfred Becker, Berlin, both of (DE)

(73) Assignee: Deutsche Telekom AG, Bonn (DE)

( * ) Notice: Under 35 U.S.C. 154(b), the term of this patent shall be extended for 0 days.

(21) Appl. No.: 08/764,000

(22) Filed: Dec. 12, 1996

(30) Foreign Application Priority Data

Dec. 13, 1995 (DE) .............................................. 195 46 443

(51) Int. Cl.$^7$ ....................................................... G02B 6/26
(52) U.S. Cl. ................................................................ 385/52
(58) Field of Search .................................. 385/50–55, 33, 385/56, 147, 75, 138; 359/163, 164, 184, 189, 634, 110; 250/551

(56) References Cited

U.S. PATENT DOCUMENTS

| | | | |
|---|---|---|---|
| 4,744,619 | * 5/1988 | Cameron | 385/52 |
| 4,752,109 | * 6/1988 | Gordon et al. | 385/52 |
| 4,867,524 | 9/1989 | Courtney et al. | |
| 5,073,002 | * 12/1991 | Hockaday | 385/52 |
| 5,381,494 | * 1/1995 | O'Donnell et al. | 385/52 |
| 5,392,372 | * 2/1995 | Kurata et al. | 385/88 |
| 5,432,877 | 7/1995 | Sun et al. | |
| 5,818,994 | * 10/1998 | Hehmann | 385/89 |

FOREIGN PATENT DOCUMENTS

| | | |
|---|---|---|
| 36 30 163 C2 | 3/1987 | (DE) . |
| 35 42 020 C2 | 6/1987 | (DE) . |
| 38 09 396 A1 | 3/1988 | (DE) . |
| 40 04 544 A1 | 2/1990 | (DE) . |
| 41 40 283 A1 | 12/1991 | (DE) . |
| 0 423 994 A1 | 4/1991 | (EP) . |
| 0 660 147 A2 | 6/1995 | (EP) . |

* cited by examiner

Primary Examiner—Akm E. Ullah
(74) Attorney, Agent, or Firm—Kenyon & Kenyon

(57) ABSTRACT

An optical and/or electro-optical connection of two optical and/or electro-optical components comprises structures with optical waveguides arranged parallel or essentially parallel to the contact face on a carrier board in the area of the connection. The two components are mounted directly on a single common carrier board by welding with electromagnetic radiation in the wavelength range around 1 μm without using any auxiliary carriers.

12 Claims, 4 Drawing Sheets

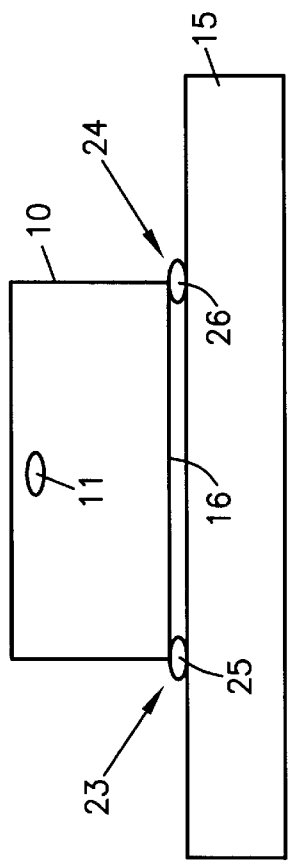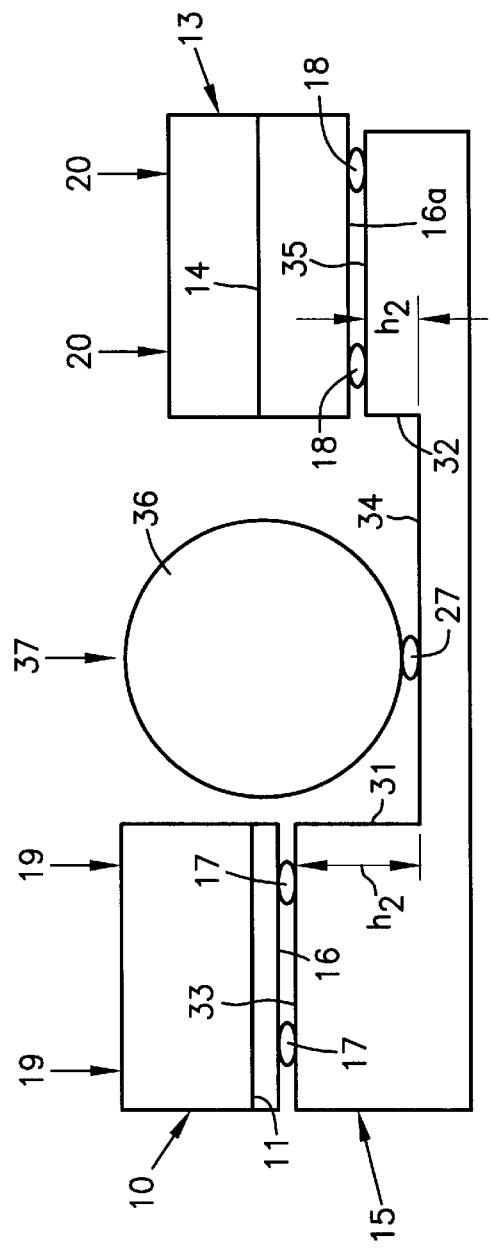

OPTICAL AND/OR ELECTRO-OPTICAL CONNECTION HAVING ELECTROMAGNETIC RADIATION-PRODUCED WELDS

FIELD OF THE INVENTION

The invention concerns an optical and/or electro-optical connection of two optical and/or electro-optical components.

RELATED TECHNOLOGY

Traditional optoelectric connections have several disadvantages. The mounting elements had a complicated structure and were bulky and expensive. In most cases, each electro-optical component had to be mounted separately on an auxiliary carrier. This necessitated additional mounting methods, e.g., soldering the laser or gluing the fibers in an assembly tube (adhesive can shrink and become brittle with age). These auxiliary carriers then had to be mounted on the main carrier. Due to the fact that now assembly errors were added (e.g., differences in thickness of the solder between the semiconductor laser and the auxiliary carrier), these arrangements were mechanically inaccurate and bulky but still sensitive to temperature and expensive because of the long assembly times.

A first attempt to improve optical and/or electro-optical connections of the type in question is disclosed in unexamined German Patent (Offenlegungsschrift) 4,140,283. However, the connection described in that publication still requires a complicated carrier structure and nothing is said about how the other components are mounted.

Fibers spliced together with thermal energy such as an electric arc as done in the past had to be protected from breakage after splicing by a mechanical device.

In arrangements where one component is soldered, the melting point of solder (120–250° C.) precludes high-temperature applications, e.g., for sensors.

With lasers, modulators, and other electro-optical components, the wire for the electric connection, such as the pump lead-in wire, in previous arrangements has been bonded. This required an extra tool (a bonding machine).

SUMMARY OF THE INVENTION

The invention concerns an optical and/or electro-optical connection of two optical and/or electro-optical components, each comprising structures with optical waveguides arranged in parallel or essentially parallel to the substrate surface on a carrier board in the area of the connection.

The wavelength range of 0.6 to 1.6 $\mu$m is very advantageous for transmission of information for such applications as optical communications technology or for sensors because of the low attenuation and low dispersion of glass fibers. Connecting the optical and electro-optical components required for this transmission in the past has been very cost-intensive, especially when the waveguides of the components to be linked to form a system are monomode waveguides. Joining tolerances in the micrometer and sub-micrometer range must often be maintained for decades despite great temperature fluctuations. The most critical component of such a system is probably an arrangement for coupling the light from a semiconductor laser transmitter into a monomode fiber because then two beams with spot widths smaller than 1 $\mu$m must be aligned so they overlap. Since the fiber has a 5-$\mu$m spot, it is advantageous to match the spot widths of the laser and the fiber to each other in a coupling arrangement. This can be accomplished by means of a lens between the laser and the fiber, by a lens attached to the end of the fiber or by a spot width taper integrated into the laser chip. Arrangements of components with similarly small spot widths such as semiconductor laser amplifiers or transceivers are comparably critical.

It is somewhat less critical to connect components having spot widths adapted to a glass fiber, such as splitters, modulators, switches, wavelength multiplexers and demultiplexers, because here again the 5-$\mu$m-spot widths and thus the joining tolerances are very small. The same thing is also true of arrangements for coupling two fibers such as splices or plugs.

The object of this invention is to create an optical and electric connection of electro-optical components that can be implemented inexpensively, with long-term stability and thermal stability to make it possible to couple information-transmitting light from one or more waveguides of one component into one or more waveguides of the other component in an economically feasible manner.

With regard to the process engineering part of the invention, an inexpensive technology for aligning and mounting components to yield long-term and thermal stability is to be made available.

According to the present invention, this object is achieved with regard to the object part of the invention with a connection of the type described above by the fact that the two components are mounted directly on just one single joint carrier board by welding with electromagnetic radiation in the wavelength range of about 1 $\mu$m without using auxiliary carriers.

Solutions with regard to the process part of the invention include a process for producing a connection as discussed above where at least one of the components (10, 13) to be mounted is made of a transparent material. The electromagnetic radiation (19, 20, 40) is selected and matched with the material of the components (10, 13) to be mounted on the carrier board (15) so that it penetrates the components (10, 13) on its path to the weld (18) without altering their function. A process for producing a connection as discussed above where the components (10, 13) to be joined are made of a non-transparent material is also provided. The electromagnetic radiation (19, 20, 40) is selected and matched with the material of the components (10, 13) to be mounted on the carrier board (15) so that it penetrates through the components (10, 13) on its path to the weld (17), forming holes (21) without altering the function of the components (FIG. 6).

Electro-optical components in the sense of the present invention are understood to be structures with optical waveguides aligned essentially parallel to the respective contact surface of the carrier board in the area of the coupling site. Examples include:

Cubic integrated optical or integrated electro-optical chips made of InP, GaAs, PbS, tantalate, glass, germanium, or silicon, e.g., semiconductor lasers, semiconductor detectors, splitters, directional couplers, switches, modulators, multiplexers and demultiplexers, flat spectrographs.

Cylindrical structures such as glass fibers.

With regard to the electromagnetic radiation to be used according to this invention, radiation from Nd-glass lasers or Nd-YAG lasers with an output wavelength in the range of $\lambda$=1 $\mu$m, for example, can be used. Other sources having similar radiation properties in the wavelength range of $\lambda$=0.2 $\mu$m to $\lambda$=2.0 $\mu$m are also possible.

An important advantage of this invention includes the fact that only a single mounting element with a simple structure is used, namely the carrier board on which all the electro-optical components plus the optional imaging arrangement, e.g., a spherical lens are mounted directly, i.e., without an intermediate carrier or an extra carrier, by a single method, namely welding with electromagnetic radiation.

Various embodiments of this invention with regard to the object part of the present invention include that the carrier board (15) has a contact face (38), and the optical and/or electro-optical components (10, 13) are arranged on the flat contact face (38) and mounted there (FIGS. 1, 2, 5 and 7). The carrier board (15) also may have two parallel stepped contact surfaces (29, 30) with one of the two components (10, 13) arranged and mounted on each surface (FIG. 3). A semiconductor on which the carrier board (15) is mounted by angled input of the electromagnetic radiation (23, 24) may serve as one (10) of the two components (10, 13) (FIG. 5) and one (10) of the two components (10, 13) may be an electro-optical component having a current lead-in wire (39) connected by electromagnetic radiation (40) (FIG. 7). One (13) of the two components (10, 13) also may be a fiber (13) that is connected to the carrier board (15) by utilizing its cylindrical lens effect on the electromagnetic radiation (20) (FIGS. 1 and 3). Moreover, both of the electro-optical components (10, 13) may be fibers that are not only attached to the carrier board (15) by the electromagnetic radiation (19, 20) but are also spliced together (FIG. 2). In addition, one (10) of the electro-optical components (10, 13) may be a semiconductor laser and the other (13) a fiber.

An optical imaging element (36) may be inserted between the two components (10, 13) to improve the optical transmission properties, and also may be mounted on the carrier board (15) by means of electromagnetic radiation (37). Optionally an (other) carrier board level (34) that is stepped with respect to the carrier board level(s) (33, 35) used for mounting the components (10, 13) is provided for mounting the imaging element (36) (FIG. 4).

Advantageous refinements of the process part of this invention include that all the joining steps required for mounting the two electro-optical components (10, 13) are carried out in a vacuum. The first component (10) also may be gripped by an auxiliary device, preferably a precision manipulator or a precision xy translation table, and may be placed with its contact surface (16) on the carrier board (15) and then shifted into its final position on the carrier board (15) by means of the auxiliary device. The second component (13) as well may be gripped by an auxiliary device, preferably a precision manipulator or a precision xy translation table, and it may be placed with its contact surface (16) on the carrier board (15). The information-transmitting light from the waveguide (11) of the first component (10) is then used for positioning (final position) the second component (13) on the carrier board (15) (active adjustment). Moreover, the second component (13) may gripped by an auxiliary device, preferably a precision manipulator or a precision xy translation table, and placed with its contact face (16) on the carrier board (15). The external shape of the components (10, 13) or auxiliary marks then is used to locate the final position of the second component (13) on the carrier board (15) (passive adjustment).

BRIEF DESCRIPTION OF THE DRAWINGS

The figures illustrate embodiments of the present invention that are described below. They show (greatly enlarged):

FIG. 4: another embodiment of a connection using a carrier board with two steps and a spherical lens, shown here in a sectional diagram according to FIGS. 1 through 3.

FIG. 5: a front view of the mounting of a semiconductor laser on a carrier board.

DETAILED DESCRIPTION

Figure 1:
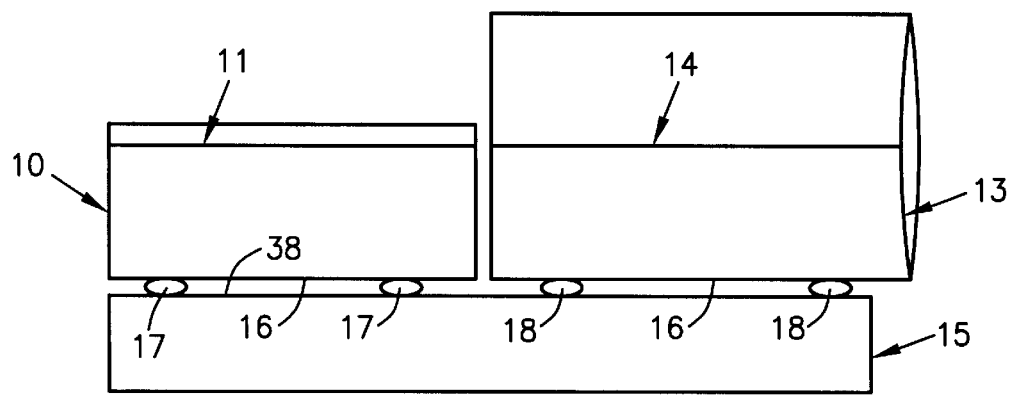
FIG. 1: a vertical section through an embodiment of an optical and/or electro-optical connection using a flat carrier board.

FIG. 1 shows an electro-optical component 10 having a waveguide 11, such as a semiconductor laser. The first component 10 works together with a second component, such as a fiber, which is labeled as 13 on the whole and has a waveguide 14. Waveguides 11 and 14 of components 10 and 13 are connected to and by means of carrier board 15. For this purpose, the two components 10 and 13 each have a contact face 16. Fusion points 17 and 18 mark the connection points of the first component 10 and the second component 13, respectively, with carrier board 15.

Figure 2:
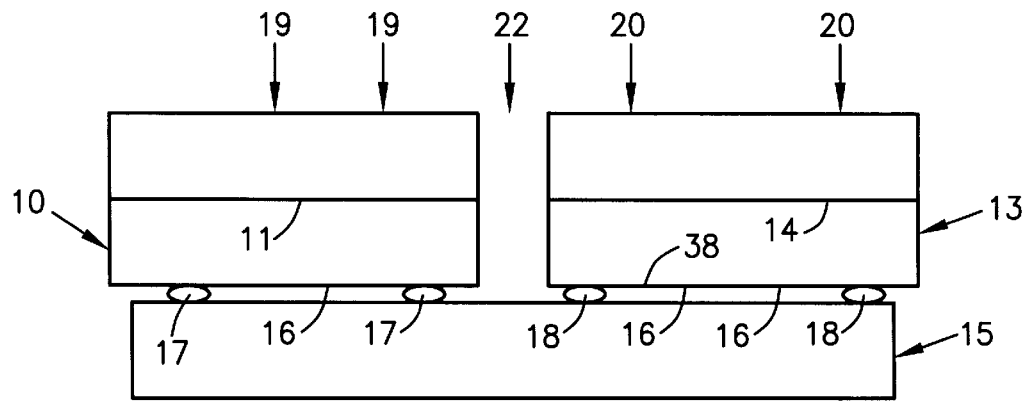
FIG. 2: a sectional diagram according to FIG. 1 of a slightly modified variant of a connection of two fibers in comparison with FIG. 1.

Arrows 19 and 20 in FIG. 2 indicate an electromagnetic radiation that is used to produce the welds (at 17, 18) and is in the wavelength range around 1 $\mu$m (preferably 1.06 $\mu$m).

If one of the two components, such as the first component 10 in FIG. 1, or both components 10, 13 in FIG. 2, are transparent to electromagnetic radiation 19 or 19 and 20, then the radiation can be supplied through the respective component 10 and/or 13 itself. However, the radiation must not impair the electro-optical function of electro-optical components 10 or 10 and 13.

Furthermore, the imaging properties of components 10 and/or 13 for radiation 19 and/or 20 are to be taken into account in producing the weld in question. If the components are designed as fibers (e.g., component 13 in FIG. 1 or components 10 and 13 in FIG. 2), then the fibers act as cylindrical lenses that result in linear fusion zones (e.g., 18).

Figure 6:
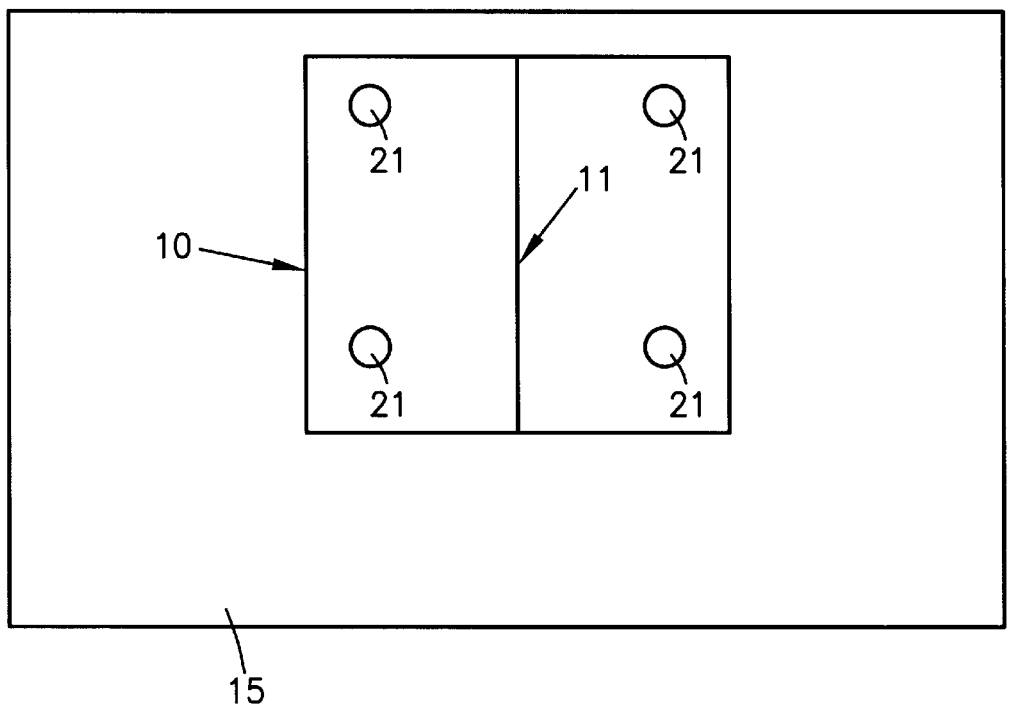
FIG. 6: a top view of the mounting of a semiconductor laser with a laser-active zone on a carrier board.

However, if the material used for components 10, 13 is not transparent to radiation 19, 20, these components can be mounted on carrier board 15 by having radiation 19, 20 fuse a hole (labeled as 21 in FIG. 6) in components 10, 13 and thus reach interfaces 16 of components 10, 13 with carrier board 15. If one of components 10 or 13 is designed as a semiconductor laser, then holes 21 must be fused next to laser-active zone 11, 14 so as not to impair the laser function (FIGS. 1 and 6). In FIG. 6, 11 is the laser-active zone of component 10. Fusion spots 17 for mounting component 10 on carrier board 15 are located beneath holes 21.

If both components 10 and 13 are designed as fibers, as in the embodiment according to FIG. 2, and are to be spliced together, the electromagnetic radiation must be supplied in the direction of arrow 22 for this purpose (FIG. 2).

To mount a component such as the first component 10 on carrier board 15, the electromagnetic radiation can also be supplied diagonally at the side, as an alternative to the radiation path illustrated in FIGS. 1 and 2. This variant of the process is diagramed in FIG. 5, where the electromagnetic radiation is indicated by arrows 23, 24, and the connection spots (welds) are labeled as 25, 26.

Figure 3:
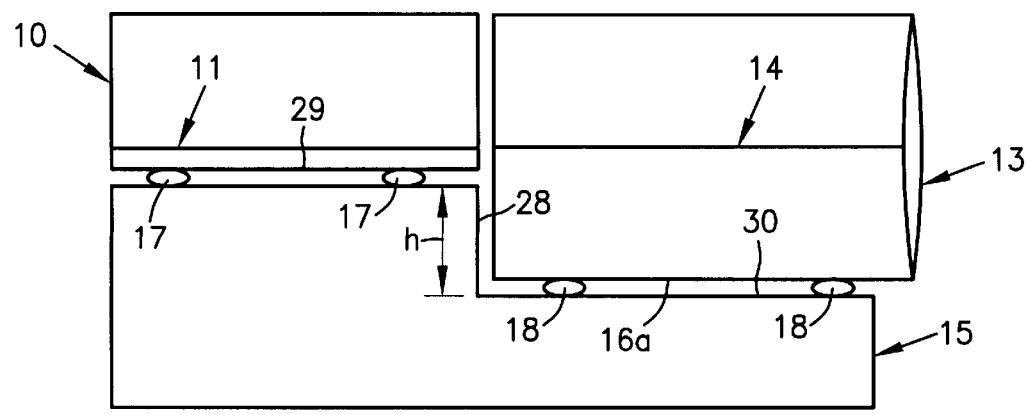
FIG. 3: another embodiment of a connection where the components are arranged on a carrier board having steps, shown here in a sectional diagram according to FIGS. 1 and 2.

In contrast with FIGS. 1, 2, and 6, carrier board 15 is designed with a step (at 28) in the embodiment according to FIG. 3, thus creating two planes 29 and 30 at different levels. Contact faces 16 and 16a of components 10 and 13, respectively, that interact with carrier board 15 are also parallel and have different levels accordingly. Otherwise, the parts in FIG. 3 that correspond to those in the embodiments according to FIGS. 1 and 2 are labeled with the same reference numbers. In the embodiment according to FIG. 4, carrier board 15 is again designed with a step, but in contrast with FIG. 3, in this case it has two steps, labeled as 31 and 32. This results in three parallel planes 33, 34, 35 at different levels on carrier board 15. The two outer carrier board levels 33 and 35 work together with the respective contact surfaces 16 and 16a of the two components 10 and 13, respectively.

Another special feature of the embodiment according to FIG. 4 includes the fact that a lens such as a spherical lens 36 is arranged and mounted on the third (middle) plane 34 of the carrier board. This is an imaging lens for adjusting the spot widths of waveguides 11 and 14 of components 10 and 13. The fusion spot for mounting spherical lens 36 on carrier board 15 (plane 34) is labeled as 27.

As in FIG. 2, arrows 19 and 20 in FIG. 4 again indicate the directions of input of the electromagnetic radiation for mounting component 10 and 13, respectively. Arrow 37 indicates the direction of input of the electromagnetic radiation for mounting spherical lens 36.

The shape of carrier board 15 is very simple in all the embodiments illustrated here. Only those surfaces of carrier board 15 on which electro-optical components 10 and 13 and optionally 36 are to be mounted require special attention. However, all other areas of carrier board 15 may have practically any desired design. If waveguides 11 of component 10 and semiconductor 14 of component 13 are the same distance from the contact face on carrier board 15 as in the embodiments according to FIGS. 1 and 2, then it is sufficient for carrier board 15 to have a single flat mounting surface (labeled as 38 in FIGS. 1 and 2).

FIG. 1 shows specifically a typical laser-fiber coupling arrangement, but it is also possible to couple a laser to a splitter, just as it is also possible to couple two lasers, such as a multi-section laser or for injection locking. Another possible application would be a series connection of splitters, where a 1-to-4 splitter is produced from three identical 1-to-2 splitters. However, a series connection of several Mach Zehnder interferometer chips to form a multiplexer or a demultiplexer is also possible.

The arrangement of a connection of two fibers illustrated in FIG. 2 permits another advantage. The electric arc energy customarily used to splice the two fibers can be replaced here by a beam (arrow 22) from an Nd-glass laser or an Nd-YAG laser, so that optical and mechanical connections can be produced with just one tool.

If waveguide 11 of component 10 and waveguide 14 of component 13 are not the same distance from the respective contact surface on carrier board 15 (this is the case in the embodiments according to FIGS. 3 and 4, for example), then carrier board 15 must be designed with steps as described above to compensate for the differences in distance from the respective contact surfaces (29, 30 in FIG. 3 or 33, 35 in FIG. 4). Step height h (FIG. 3) or $h_1-h_2$ (FIG. 4) is thus equal to the difference between the distance from waveguide 11 to contact surface 29 and the distance from waveguide 14 to contact surface 30 (FIG. 3) or the difference between the distance from waveguide 11 to contact surface 33 and from waveguide 14 to contact surface 35 (FIG. 4).

Spherical lens 36 provided in the embodiment according to FIG. 4 serves to adjust the light guided in waveguides 11 and 14. Spherical lens 36 is mounted with electromagnetic radiation 37 (at 27 on surface 34 of carrier board 15).

Figure 4A:
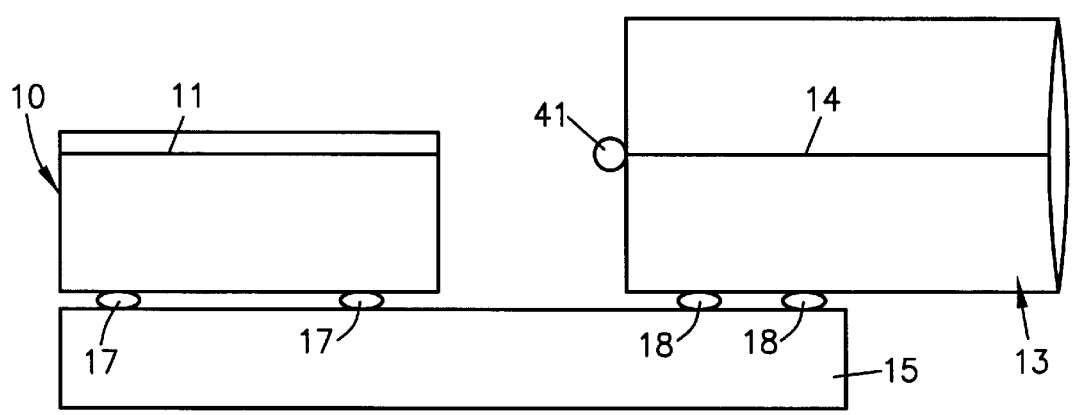
FIG. 4a: a sectional diagram according to FIG. 4 of another variant of a connection where a special lens is used but with a flat carrier board in contrast to FIG. 4.

Other lenses such as cylindrical lenses can also be used. FIG. 4a shows an advantageous embodiment of such a design, where a cylindrical lens 41 that is used for adjusting the spot width, as is already known, is connected first to one of components 10 or 13 (13 here). Only then are components 10 and 13 connected to each other according to this invention. Other known embodiments of components 10 and/or 13, where component 13 has a fiber end in the form of a lens, for example, can also be connected with the measures according to the present invention.

The arrangements according to FIGS. 5 and 6 show specifically a semiconductor laser (10, 11) mounted on carrier board 15. In the variant according to FIG. 5 (front view), electromagnetic radiation 23, 24 is guided laterally to fusion zones 25, 26, as explained above. In the variant according to FIG. 6, the radiation is supplied directly from above (normal to the plane of the drawing) and cuts a hole 21 to reach fusion zones 17.

Figure 7:
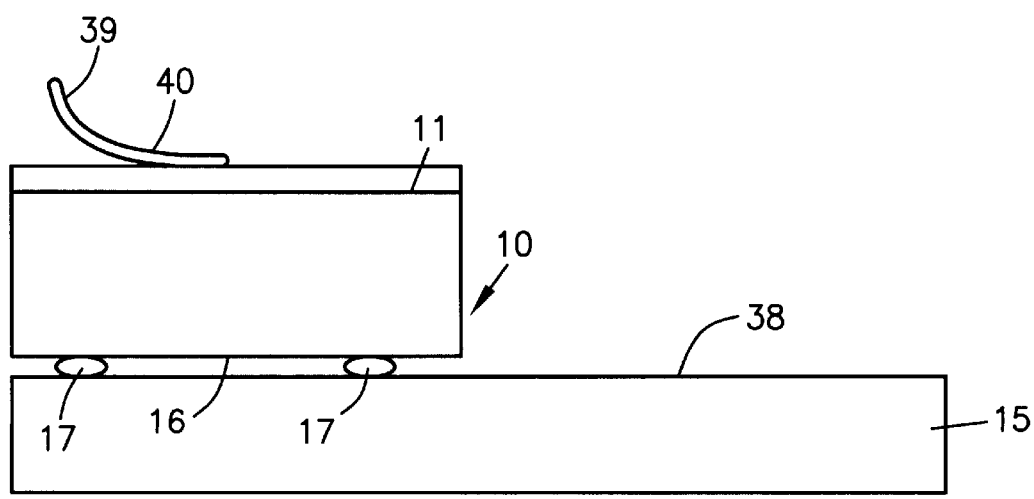
FIG. 7: a sectional view according to FIGS. 1 through 4 of the mounting of a pump lead-in wire on a semiconductor laser.

In the embodiment according to FIG. 7, a semiconductor laser having a waveguide 11 is mounted by means of fusion spots 17 on a carrier board 15 having a continuous flat contact surface 38. So far, this all corresponds to the embodiment according to FIG. 1 (see left side there). The special feature of the variant according to FIG. 7 includes the fact that a pump lead-in wire 39 is connected to semiconductor laser 10 by electromagnetic radiation 40. In this case, as indicated by an arrow, radiation 40 is supplied perpendicularly from above.

In any case, in all the embodiments illustrated and described here, the electromagnetic radiation must be supplied in such a way that it causes the material of joining partners 10 and 15 or 13 and 15 or 39 and 10 (FIG. 7) or 39 and 13 (not shown) or 36 and 15 (FIG. 4) to melt in zones 17 and 18 (FIGS. 1 to 4 and 7), 25 and 26 (FIG. 5), 27 (FIG. 4) and 21 (FIG. 6), respectively, so a joint based on fusion of the joining partners is obtained after cooling.

Suitable materials for carrier board 15 include all materials that can be welded with electromagnetic radiation, specifically metals, preferably copper and Kovar, but also silicon or glass. Suitability of these materials for the purposes of the present invention has been demonstrated experimentally.

Supplying radiation 19 through component 10 (FIGS. 1 and 2) permits the following procedure: Component 10 is gripped by an auxiliary device (not shown) such as a precision manipulator or a precision xy translation table and is placed with its contact surface 16 on carrier board 15 and then shifted into its final position by the auxiliary device. Then it is secured in this position by turning on radiation 19.

Component 13 can be mounted in the same way, optionally using the information-carrying light from waveguide 11 of component 10 to locate the position of component 13 (active adjustment). As an alternative, the desired position of component 13 can also be located by the external shapes of components 10 and 13 or with auxiliary markings (not shown) without using the information-carrying light from component 10 or component 13 (passive adjustment). In both cases, alignment is necessary in only two coordinate directions, because the third coordinate is determined by surface 38 or 29, 30 or 33, 34, 35 of carrier board 15. If one of components 10 or 13 is a laser, the electromagnetic radiation used for mounting can also be used to attach wire 39 for supplying the pump current to the laser (see FIG. 7 and the relevant discussion above).

Welding in vacuo is advantageous because the heat introduced by the electromagnetic radiation is dissipated more slowly in a vacuum and thus a lower radiation power can be used, and gases evolved from the materials of the joining partners in the welding plasma will diffuse away more rapidly in vacuo than in air. This minimizes negative effects on the joining partners (10, 15 or 13, 15 or 36, 15 or 39, 10) due to deposition of such gases on the reflective surface of a laser, for example.

In summary, the following advantageous effects can be achieved by this invention:

An inexpensive carrier board 15 with a simple structure is used: only one flat contact face (38 or 29, 30 or 33 to 35) is required, optionally with a step (28 or 31, 32). No mounting grooves are required on carrier board 15. Except for carrier board 15, no additional mounting element is needed. Requirement: The distances between waveguides 11 and 14 and the respective contact faces on carrier board 15 must be known with sufficient accuracy.

The joining partners (10, 13, 36) are mounted directly on carrier board 15, so the possibility of assembly errors is eliminated.

Alignment is required in only two coordinate directions, thus permitting a great variability in placement of the components (10, 13).

Compact design (module size for laser-fiber coupling not including casing <1 mm$^3$).

Little distortion in mounting, because the volume of fused material can be minimized.

Simple and inexpensive mounting of all parts to be joined (Nd-glass lasers are available for only DM 10,000, about $6700 at current exchange rates).

No soldering, gluing or bonding tools needed.

Long lifetime (no adhesive or solder required).

Can be used at high temperatures (in test runs an InP laser would deliver light even at 250° C., so temperatures up to 400° C. seem possible).

Versatility in use (e.g., laser-fiber coupling, replacement for mechanical or thermal splicing, series connection of splitters or Mach Zehnder interferometer chips).

What is claimed is:

1. A connection for two optical and/or electro-optical components comprising:

a single carrier board having at least one contact surface, the at least one contact surface being arranged parallel or essentially parallel to optical waveguides of the two components; and the single carrier board directly supporting the two components by welds, the welds being produced with electromagnetic radiation in the wavelength range of 0.2 μm to 2.0 μm without the use of auxiliary carriers.

2. The connection as recited in claim 1 wherein the carrier board has a flat contact surface and the two components are arranged on the flat contact surface and mounted thereon.

3. The connection as recited in claim 1 wherein the carrier board comprises two parallel stepped contact surfaces with one of the two components arranged and mounted on each contact surface.

4. The connection as recited in claim 1 wherein one of the two components is a semiconductor laser which is mounted on the carrier board by angled input of the electromagnetic radiation.

5. The connection as recited in claim 1 wherein one of the two components is an electro-optical component having a current lead-in wire fixed by means of the electromagnetic radiation.

6. The connection as recited in claim 1 wherein one of the two components is a fiber connected to the carrier board, the fiber having a cylindrical lens effect on the electromagnetic radiation.

7. The connection as recited in claim 1 wherein both of the two components are fibers that are not only attached to the carrier board by the electromagnetic radiation but are also spliced together.

8. The connection as recited in claim 1 wherein one of the two components is a semiconductor laser and the other is a fiber.

9. The connection as recited in claim 1 further comprising an optical imaging element inserted between the two components.

10. The connection as recited in claim 9 further comprising an additional weld, the imaging element being mounted on the carrier board by the additional weld.

11. The connection as recited in claim 9 wherein the carrier board comprises an additional contact surface for the optical imaging element, the additional contact surface being stepped with respect to the other contact surfaces.

12. The connection as recited in claim 9 wherein the optical imaging element is a spherical lens.

* * * * *